(12) United States Patent
Kim et al.

(10) Patent No.: US 10,826,436 B2
(45) Date of Patent: *Nov. 3, 2020

(54) POWER SUPPLY MODULATOR AND WIRELESS COMMUNICATION APPARATUS INCLUDING THE SAME

(71) Applicant: SAMSUNG ELECTRONICS CO., LTD., Suwon-si (KR)

(72) Inventors: Dong-su Kim, Suwon-si (KR); Jun-suk Bang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/864,483

(22) Filed: May 1, 2020

(65) Prior Publication Data
US 2020/0259457 A1 Aug. 13, 2020

Related U.S. Application Data

(63) Continuation of application No. 16/539,633, filed on Aug. 13, 2019, now Pat. No. 10,644,651.

(30) Foreign Application Priority Data

Jan. 3, 2019 (KR) .......................... 10-2019-0000859

(51) Int. Cl.
*H04W 52/02* (2009.01)
*H03F 1/02* (2006.01)
(Continued)

(52) U.S. Cl.
CPC ............. *H03F 1/0222* (2013.01); *H03F 3/24* (2013.01); *H04W 52/0261* (2013.01);
(Continued)

(58) Field of Classification Search
CPC .... H03F 3/24; H03F 1/0227; H03F 2200/102; H03F 2200/105; H03F 2200/465; H03F 2200/504; H03F 2200/451; H03F 3/245; H03F 1/02; H03F 1/32; H03F 1/56; H03F 2200/511; H03F 3/213; H04B 2001/0408;
(Continued)

(56) References Cited

U.S. PATENT DOCUMENTS 9,246,460 B2  1/2016 Khlat et al.
9,473,023 B2  10/2016 Vannorsdel et al.
(Continued)

FOREIGN PATENT DOCUMENTS

KR  10-2016-0028943 A  3/2016

*Primary Examiner* — Quan M Hua
(74) *Attorney, Agent, or Firm* — Sughrue Mion, PLLC

(57) ABSTRACT

A power supply modulator includes: a linear regulator; a switching regulator; and a mode-based connection circuit. The mode-based connection circuit includes a coupling circuit configured to drop an output signal of the linear regulator by a target coupling voltage in an envelope tracking (ET) modulation mode; and a coupling voltage management circuit configured to monitor a coupling voltage of the coupling circuit in another modulation mode, and selectively apply a voltage to the coupling voltage based on a monitoring result such that the coupling voltage is maintained at the target coupling voltage.

20 Claims, 12 Drawing Sheets

(51) Int. Cl.
*H03F 3/24* (2006.01)
*H04B 1/40* (2015.01)

(52) U.S. Cl.
CPC .. *H03F 2200/102* (2013.01); *H03F 2200/105* (2013.01); *H03F 2200/451* (2013.01); *H04B 1/40* (2013.01)

(58) Field of Classification Search
CPC ... H04B 2001/0416; H04B 2001/0425; H02M 2001/0045; H04W 52/05
See application file for complete search history.

(56) References Cited

U.S. PATENT DOCUMENTS

| | | |
|---|---|---|
| 9,525,384 B2 | 12/2016 | Lee et al. |
| 9,634,620 B2 | 4/2017 | Khlat et al. |
| 9,929,696 B2 | 3/2018 | Khlat et al. |
| 9,948,240 B2 | 4/2018 | Khlat et al. |
| 9,954,490 B2 | 4/2018 | Watkins |
| 10,644,651 B1* | 5/2020 | Kim ............... H03F 1/0222 |
| 2008/0303492 A1* | 12/2008 | Aiura ............. H02M 1/44 323/270 |
| 2014/0057575 A1* | 2/2014 | Ayukawa ......... H02M 3/156 455/73 |
| 2016/0373144 A1 | 12/2016 | Takenaka |
| 2019/0302817 A1* | 10/2019 | Rosolowski ...... H02M 3/158 |

* cited by examiner

POWER SUPPLY MODULATOR AND WIRELESS COMMUNICATION APPARATUS INCLUDING THE SAME

CROSS-REFERENCE TO THE RELATED APPLICATION

This is a continuation application of U.S. application Ser. No. 16/539,633 filed Aug. 13, 2019, which claims priority from Korean Patent Application No. 10-2019-0000859, filed on Jan. 3, 2019, in the Korean Intellectual Property Office, the disclosure of which is herein incorporated by reference in its entirety.

BACKGROUND

1. Field

One or more example embodiments relate to a power supply modulator of a wireless communication apparatus used in a wireless communication system, and a wireless communication apparatus including the same.

2. Description of the Related Art

In a wireless communication apparatus, particularly, a portable terminal, in which battery power consumption is important, a highly efficient radio frequency (RF)/analog power amplifier for a long battery use time is needed. Recently, wireless communication has been evolved to next-generation communication technology, thereby demanding a technique capable of obtaining a high-efficiency characteristic even in a high peak-to-average power ratio (PAPR) characteristic. Due to development of the next-generation communication technology, terminal hardware capable of supporting a high linear characteristic and a wide bandwidth is needed. Therefore, an RF/analog power amplifier for a wireless communication apparatus is required to satisfy all of the above requirements, but it is difficult to satisfy all of the requirements due to the limitation in a process and a circuit structure.

The efficiency of an RF power amplifier (or RF PA) decreases as a PAPR of an input signal increases. However, a high PAPR characteristic requires a high 1-dB gain compression point (P1 dB) and saturated power of the RF power amplifier, and thus, an existing RF power amplifier operating with a fixed power supply such as a battery has low power efficiency in both peak power and back-off power regions. Therefore, to improve the low power efficiency characteristic in the back-off power region, average power tracking (APT) technology for regulating a power supply voltage while tracking average power has been developed. However, when employing the APT technology, the power supply voltage cannot instantaneously follow an envelope signal, and accordingly, an RF power amplifier has additional power loss. Technology developed to compensate for this power loss is envelope tracking (ET) technology. The ET technology is one of the technologies of improving the efficiency of an RF power amplifier and improves a power efficiency characteristic of an RF power amplifier while instantaneously following an input envelope signal. Therefore, to apply the ET technology to an RF power amplifier, a power supply modulator for normalizing battery power to an envelope signal is necessary.

The power supply modulator is required to have both a high bandwidth and high efficiency, and to this end, a hybrid structure of a combination of a switching regulator and a linear regulator including a linear amplifier is generally used. However, when the hybrid structure is used, it is difficult to maintain a voltage of both terminals of a coupling circuit connected between the linear regulator and the switching regulator at a certain level due to a floating state, surrounding noise, and the like, and thus, an effective modulation operation cannot be performed.

SUMMARY

One or more example embodiments provide a power supply modulator capable of efficiently using power and improving the performance of a modulation operation, and a wireless communication apparatus including the same.

According to an aspect of an example embodiment, there is provided a power supply modulator including: a linear regulator; a switching regulator; and a mode-based connection circuit. The mode-based connection circuit includes a coupling circuit configured to drop an output signal of the linear regulator by a target coupling voltage in an envelope tracking (ET) modulation mode; and a coupling voltage management circuit configured to monitor a coupling voltage of the coupling circuit in another modulation mode, and selectively apply a voltage to the coupling voltage based on a monitoring result such that the coupling voltage is maintained at the target coupling voltage.

According to an aspect of an example embodiment, there is provided a power supply modulator operating in a plurality of modulation modes, the power supply modulator including: a linear regulator configured to output an envelope signal in an envelope tracking (ET) modulation mode; a switching regulator configured to output a direct current (DC) signal in the ET modulation mode or an average power tracking (APT) modulation mode; a coupling circuit configured to drop an output signal of the linear regulator by a target coupling voltage by coupling an alternating current (AC) signal from the envelope signal of the linear regulator in the ET modulation mode; and a coupling voltage management circuit configured to selectively apply a voltage to at least one of a first terminal or a second terminal of the coupling circuit to maintain a coupling voltage of the coupling circuit at the target coupling voltage in a modulation mode other than the ET modulation mode.

According to an aspect of an example embodiment, there is provided a wireless communication apparatus, including: a power supply modulator, a model, and a radio frequency (RF) power amplifier. The power supply modulator includes a linear regulator, a switching regulator, and a coupling circuit connected between an output terminal of the linear regulator and an output terminal of the switching regulator, the power supply modulator configured to operate in a plurality of modulation modes, a target coupling voltage being applied across a first terminal and a second terminal of the coupling circuit in an envelope tracking (ET) modulation mode. The modem is configured to control a modulation mode of the power supply modulator. The RF power amplifier configured to amplify an RF signal based on a voltage supplied from the power supply modulator and output to the amplified RF signal. The power supply modulator is configured to monitor a voltage across the first terminal and the second terminal of the coupling circuit in at least one modulation mode other than the ET modulation mode, and selectively apply a voltage to the coupling circuit based on a result of monitoring such that the voltage across the coupling circuit has the target coupling voltage.

BRIEF DESCRIPTION OF THE DRAWINGS

These and/or other aspects will become apparent and more readily appreciated from the following description of the embodiments, taken in conjunction with the accompanying drawing, in which.

DETAILED DESCRIPTION

Hereinafter, example embodiments will be described in detail with reference to the accompanying drawings.

Figure 1:
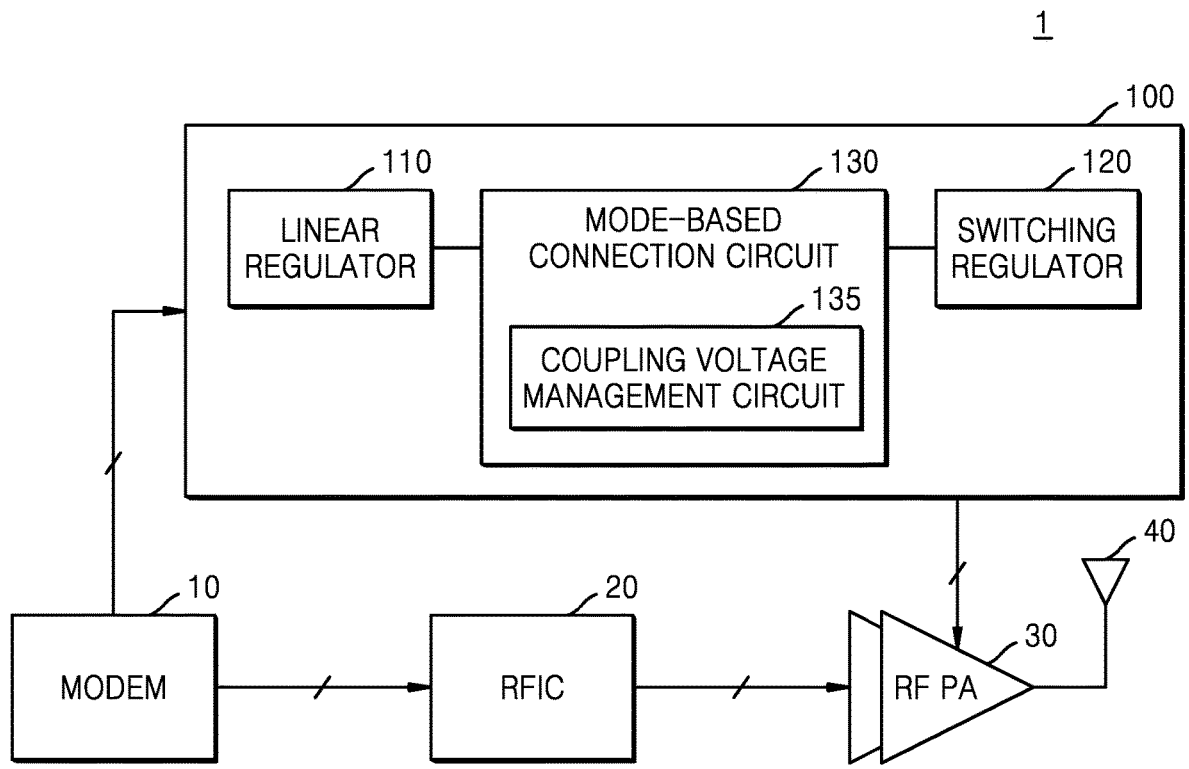
FIG. 1 is a block diagram of a wireless communication apparatus including a power supply modulator, according to an example embodiment.

FIG. 1 is a block diagram of a wireless communication apparatus 1 including a power supply modulator 100, according to an example embodiment.

Referring to FIG. 1, the wireless communication apparatus 1 may include a modem 10, a radio frequency integrated circuit (RFIC) 20, an RF power amplifier 30, and the power supply modulator 100. The modem 10 may provide, to the RFIC 20, a transmission signal including information to be transmitted. The modem 10 may provide, to the power supply modulator 100, an envelope signal generated through amplitude modulation of the transmission signal. In this case, the power supply modulator 100 may operate in a plurality of modulation modes, and the modem 10 may provide, to the power supply modulator 100, a modulation mode control signal for modulation mode control.

The RFIC 20 may output an RF signal by modulating the transmission signal into a carrier of a system band, and the RF power amplifier 30 may amplify the RF signal to an appropriate power level and transmit the amplified RF signal to another wireless communication apparatus, a base station, and/or the like, through an antenna 40.

According to embodiments, the power supply modulator 100 may modulate a voltage of a power supply (e.g., an internal power supply of the wireless communication apparatus 1) according to a set modulation mode through a process of amplifying and normalizing the envelope signal input from the modem 10 and provide the modulated voltage to the RF power amplifier 30. The power supply modulator 100 may control a fixed supply voltage provided from the internal power supply (e.g., a battery) of the wireless communication apparatus 1 according to the envelope signal, such that the power supply modulator 100 and the RF power amplifier 30 have optimal linearity and energy efficiency.

To support the plurality of modulation modes, the power supply modulator 100 may include a linear regulator 110, a switching regulator 120, and a mode-based connection circuit 130. According to an example embodiment, the modulation modes may include, for example but not limited to, an average power tracking (APT) modulation mode, an envelope tracking (ET) modulation mode, a standby mode, and the like. Hereinafter, it will be mainly described that the power supply modulator 100 supports the APT modulation mode, the ET modulation mode, and the standby mode, but this is only an example embodiment, and the power supply modulator 100 is not limited thereto and may support more various modulation modes.

The power supply modulator 100 may have a hybrid structure of a combination of the linear regulator 110 and the switching regulator 120, and outputs of the linear regulator 110 and the switching regulator 120 may be combined and provided as a supply voltage to the RF power amplifier 30. The linear regulator 110 may guarantee high output accuracy of the RF power amplifier 30 with respect to the supply voltage by tracking a high frequency region of the envelope signal, and the switching regulator 120 may track a low frequency region of the envelope signal to provide an output voltage of a wide range. Each of the linear regulator 110 and the switching regulator 120 may be enabled/disabled according to a modulation mode of the power supply modulator 100, and the mode-based connection circuit 130 may control a connection between the linear regulator 110 and the switching regulator 120 according to the modulation mode. A structure and an operation of the mode-based connection circuit 130 will be described in detail with reference to FIGS. 5A and 5B and the like.

The mode-based connection circuit 130 may include a coupling circuit (not shown) configured to drop an output signal of the linear regulator 110 by a desired coupling voltage (hereinafter, the desired coupling voltage is referred to as a target coupling voltage) by coupling an alternating current (AC) signal from the output signal of the linear regulator 110 in the ET modulation mode of the power supply modulator 100. In the related art, it is difficult that the coupling circuit maintains a coupling voltage of both terminals of the coupling circuit to the target coupling voltage, due to various causes such as a change in circuit connection and the occurrence of noise when the power supply modulator 100 switches from the ET modulation mode to another modulation mode. Accordingly, when the power supply modulator 100 switches back to the ET modulation mode, a certain time is taken until a coupling voltage of the coupling circuit approaches the target coupling voltage, which negatively affects the output signal of the linear regulator 110, and thus, it is difficult that the power supply modulator 100 smoothly operates in the ET modulation mode.

To prevent these problems, according to an example embodiment, the mode-based connection circuit 130 may include a coupling voltage management circuit 135 to control such that the coupling voltage of the coupling circuit is maintained as the target coupling voltage even in modulation modes other than the ET modulation mode. The coupling voltage management circuit 135 may be variously implemented according to circuit configurations of the mode-based connection circuit 130 configured to control a connection between the linear regulator 110 and the switching regulator 120 according to a modulation mode. The coupling voltage management circuit 135 may perform an operation of selectively applying a voltage to both terminals of the coupling circuit such that the coupling voltage of the coupling circuit is maintained as the target coupling voltage in modulation modes other than the ET modulation mode.

According to an example embodiment, the coupling voltage management circuit 135 may monitor the coupling voltage of the coupling circuit by being connected to the both terminals of the coupling circuit. That is, the coupling voltage management circuit 135 may continuously monitor whether the coupling voltage of the coupling circuit is maintained as or approaches the target coupling voltage in a modulation mode other than the ET modulation mode and perform a selective voltage applying operation on the coupling circuit based on the monitoring result.

For example, in a modulation mode (e.g., the APT modulation mode) other than the ET modulation mode, the coupling voltage management circuit 135 may apply a first voltage to a first terminal of the coupling circuit such that the coupling voltage of the coupling circuit approaches the target coupling voltage, by dropping the coupling voltage when the coupling voltage of the coupling circuit is higher than the target coupling voltage and may apply a second voltage to the first terminal of the coupling circuit such that the coupling voltage of the coupling circuit approaches the target coupling voltage, by boosting the coupling voltage when the coupling voltage is lower than the target coupling voltage. That is, the coupling voltage management circuit 135 may selectively apply different voltages to the same terminal of the coupling circuit such that the coupling voltage of the coupling circuit is maintained as the target coupling voltage.

As another example, in another modulation mode (e.g., the standby mode) other than the ET modulation mode, the coupling voltage management circuit 135 may apply a third voltage to the first terminal of the coupling circuit and apply a fourth voltage to a second terminal of the coupling circuit such that the coupling voltage of the coupling circuit approaches the target coupling voltage. That is, the coupling voltage management circuit 135 may apply different voltages to different terminals of the coupling circuit such that the coupling voltage of the coupling circuit is maintained as (or approaches) the target coupling voltage. The first to fourth voltages may have the same or different voltage levels, respectively and may be variously implemented according to voltages provided to the power supply modulator 100. A detailed description of the first to fourth voltages will be made with reference to FIG. 7 and the like. Hereinafter, the standby mode of the power supply modulator 100 may be a mode for preparing an operation in another modulation mode (e.g., the ET modulation mode or the APT modulation mode). For example, the power supply modulator 100 may operate in the standby mode at a time point close to a time point when the wireless communication apparatus 1 switched from a power-off state to a power-on state, or when there is no RF signal to be output through the RF power amplifier 30.

As described above, according to an example embodiment, the coupling voltage management circuit 135 may perform different voltage applying operation methods for maintaining the coupling voltage of the coupling circuit as the target coupling voltage according to types of modulation modes other than the ET modulation mode.

According to an example embodiment, the coupling voltage management circuit 135 may manage the coupling circuit of the power supply modulator 100 that supports a plurality of modulation modes such that the coupling circuit has the target coupling voltage in advance, thereby allowing for efficient use of power and simultaneously improving the modulation performance when the power supply modulator 100 performs a power supply modulation operation based on the ET modulation mode.

Figure 2:
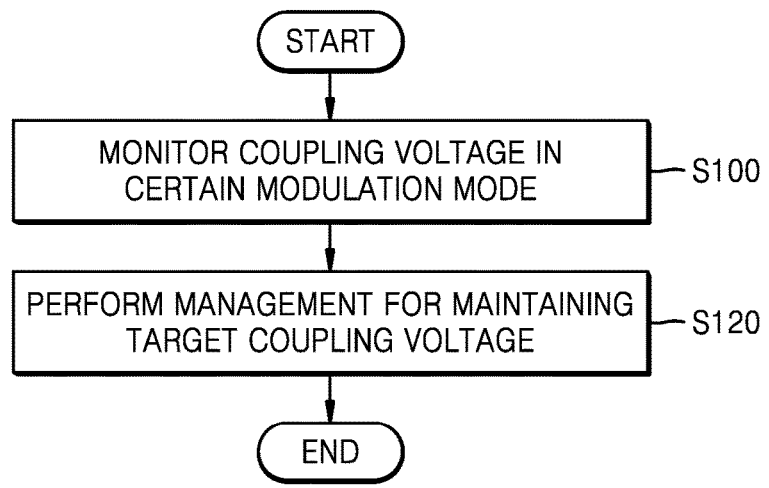
FIG. 2 is a flowchart of an operation of a coupling voltage management circuit of FIG. 1, according to an example embodiment.

FIG. 2 is a flowchart of an operation of the coupling voltage management circuit 135 of FIG. 1, according to an example embodiment.

Referring to FIGS. 1 and 2, the coupling voltage management circuit 135 may monitor the coupling voltage of the coupling circuit when the power supply modulator 100 is in a certain modulation mode. In detail, the coupling voltage management circuit 135 may monitor a voltage (or coupling voltage) of both terminals of the coupling circuit by being connected to the both terminals of the coupling circuit in operation S100. According to an example embodiment, the coupling voltage management circuit 135 may monitor the coupling voltage of the coupling circuit in at least one modulation mode other than the ET modulation mode. The modulation mode in which the coupling voltage management circuit 135 monitors the coupling voltage of the coupling circuit may be preset. For example, the modulation mode of monitoring the coupling voltage may be set to the APT modulation mode or the standby mode.

In operation S120, the coupling voltage management circuit 135 may perform management for maintaining the coupling voltage of the coupling circuit as the target coupling voltage based on the monitoring result. However, according to an example embodiment, the coupling voltage management circuit 135 may not monitor the coupling voltage of the coupling circuit in a certain modulation mode (e.g., the standby mode) and may directly apply, without the monitoring result, a certain voltage to one terminal or both terminals of the coupling circuit to control a voltage of the both terminals of the coupling circuit such that the voltage of the both terminals of the coupling circuit approaches the target coupling voltage.

Figure 3:
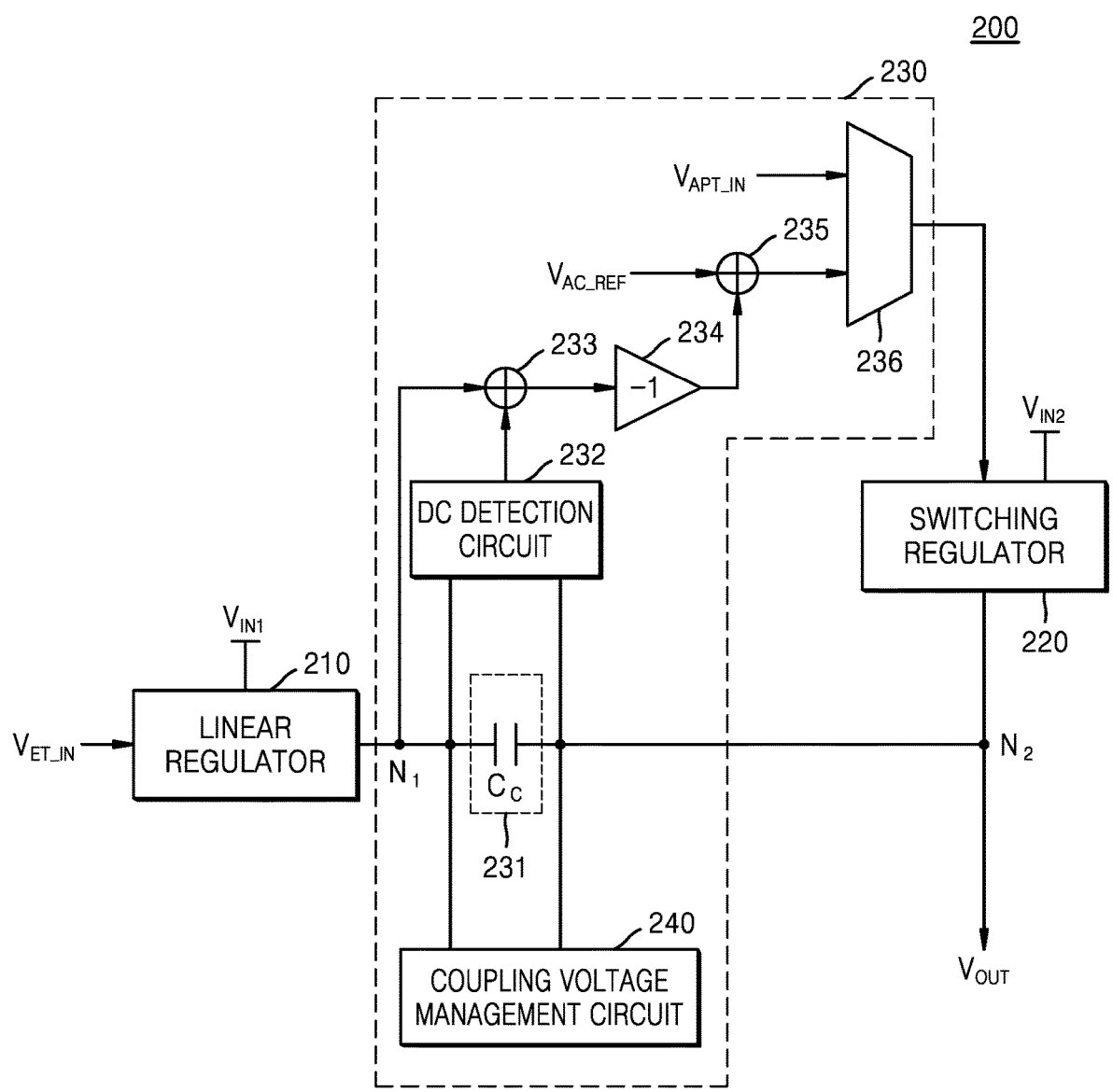
FIG. 3 is a block diagram of a power supply modulator according to an example embodiment.

FIG. 3 is a block diagram of a power supply modulator 200 according to an example embodiment.

Referring to FIG. 3, the power supply modulator 200 may include a linear regulator 210, a switching regulator 220, and a mode-based connection circuit 230. The mode-based connection circuit 230 may include a coupling circuit 231, a direct current (DC) detection circuit 232, combiners 233 and 235, a buffer 234 ('−1' used in the inside of the buffer 234 indicates a buffer configured to provide a negative feedback), a multiplexer 236, and a coupling voltage management circuit 240. A configuration of the DC detection circuit 232, the combiners 233 and 235, the buffer 234, and the multiplexer 236 for an ET modulation operation is only an example embodiment, and thus, the power supply modulator 200 is not limited thereto and may be implemented by various circuit configurations to perform an effective ET modulation operation.

Further, the embodiment shown in FIG. 3 is only illustrative, and thus, example embodiments are not limited thereto, and the mode-based connection circuit 230 may be implemented by various circuit configurations to support a plurality of modulation modes by using the linear regulator 210 and the switching regulator 220. Hereinafter, for illustrative purposes, a configuration of the power supply modulator 200 shown in FIG. 3 will be mainly described, but it would be obvious that a configuration and an operation of the coupling voltage management circuit 240 according to an example embodiment may be applied to variously implemented configurations of the power supply modulator 200.

The mode-based connection circuit 230 may be connected to an output terminal of the linear regulator 210 and an input terminal and an output terminal of the switching regulator 220. In detail, the mode-based connection circuit 230 may be connected to the linear regulator 210 through a first node $N_1$ where the output terminal of the linear regulator 210 meets a first terminal of the coupling circuit 231. In addition, the mode-based connection circuit 230 may be connected to the switching regulator 220 through a second node $N_2$ where the output terminal of the switching regulator 220 meets a second terminal of the coupling circuit 231 and an output terminal of the multiplexer 236. According to an example embodiment, the coupling circuit 231 may include a coupling capacitor $C_C$, and the first terminal and the second terminal of the coupling circuit 231 may be connected to the DC detection circuit 232 and the coupling voltage management circuit 240, respectively. For example, in the ET modulation mode, the linear regulator 210 may receive a first envelope signal $V_{ET\_IN}$ from a modem (e.g., 10 of FIG. 1), and the switching regulator 220 may receive a signal generated in the mode-based connection circuit 230 through the multiplexer 236. As another example, in the APT modulation mode, the switching regulator 220 may receive a second envelope signal $V_{APT\_IN}$ from the modem through the multiplexer 236. A detailed description of the mode-based connection circuit 230 for each modulation mode will be made later with reference to FIGS. 5A and 5B.

The linear regulator 210 may receive a first supply voltage $V_{IN1}$ of which a level has been regulated from a voltage of an internal power supply (e.g., battery) of a wireless communication apparatus (e.g., 1 of FIG. 1). The power supply modulator 200 may further include a DC-DC converter (e.g., buck-boost converter) configured to generate the first supply voltage $V_{IN1}$. The switching regulator 220 may receive the voltage of the internal power supply of the wireless communication apparatus as a second supply voltage $V_{IN2}$. According to an example embodiment, a level of the first supply voltage $V_{IN1}$ may differ from a level of the second supply voltage $V_{IN2}$. However, this is only an example embodiment, and thus, a method of generating the first supply voltage $V_{IN1}$ and the second supply voltage $V_{IN2}$ may vary according to configurations of the power supply modulator 200 or configurations of the wireless communication apparatus.

The coupling voltage management circuit 240 may be connected to the coupling circuit 231 through the first node $N_1$ and the second node $N_2$. Although FIG. 3 shows that the coupling voltage management circuit 240 is connected to the coupling circuit 231 through two lines, this is only illustrative, and the coupling voltage management circuit 240 may be connected to the coupling circuit 231 through more than two lines. According to an example embodiment, the coupling voltage management circuit 240 may be connected to the coupling circuit 231 through lines for monitoring a coupling voltage of the coupling circuit 231 and lines for controlling the coupling voltage to be maintained at or approach the target coupling voltage.

A detailed description of an operation of selectively applying a voltage to allow the coupling circuit 231 of the coupling voltage management circuit 240 to have the target coupling voltage will be made later with reference to FIGS. 5A and 5B.

Figure 4:
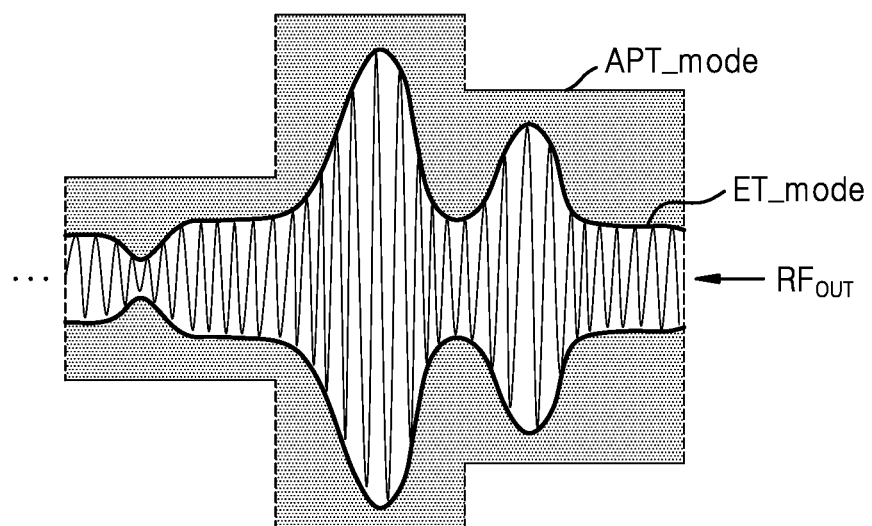
FIG. 4 is a diagram for describing operations of a power supply modulator in an envelope tracking (ET) modulation mode and an average power tracking (APT) modulation mode.

FIG. 4 is a diagram for describing operations of a power supply modulator in an ET modulation mode ET_mode and an APT modulation mode APT_mode.

Referring to FIGS. 1 and 4, the power supply modulator 100 may instantaneously track an RF signal $RF_{OUT}$ input to the RF power amplifier 30 in the ET modulation mode ET_mode and provide, to the RF power amplifier 30, a first supply voltage generated as the tracking result. The power supply modulator 100 may track average power in a certain period of the RF signal $RF_{OUT}$ that is input to the RF power amplifier 30 in the APT modulation mode APT_mode and provide, to the RF power amplifier 30, a second supply voltage generated as the tracking result. That is, the power supply modulator 100 may operate in the ET modulation mode ET_mode or the APT modulation mode APT_mode according to a communication environment, a data amount included in an RF signal and the like and may further operate in the standby mode to prepare an operation in the ET modulation mode ET_mode or the APT modulation mode APT_mode. In this case, the coupling voltage management circuit 135 may manage a coupling voltage of a coupling circuit in a modulation mode other than the ET modulation mode ET_mode such that the power supply modulator 100 in the ET modulation mode ET_mode may perform an accurate power supply modulation operation. However, this is only an example embodiment, and thus, the power supply modulator 100 may operate in more various modulation modes.

Figure 5A:
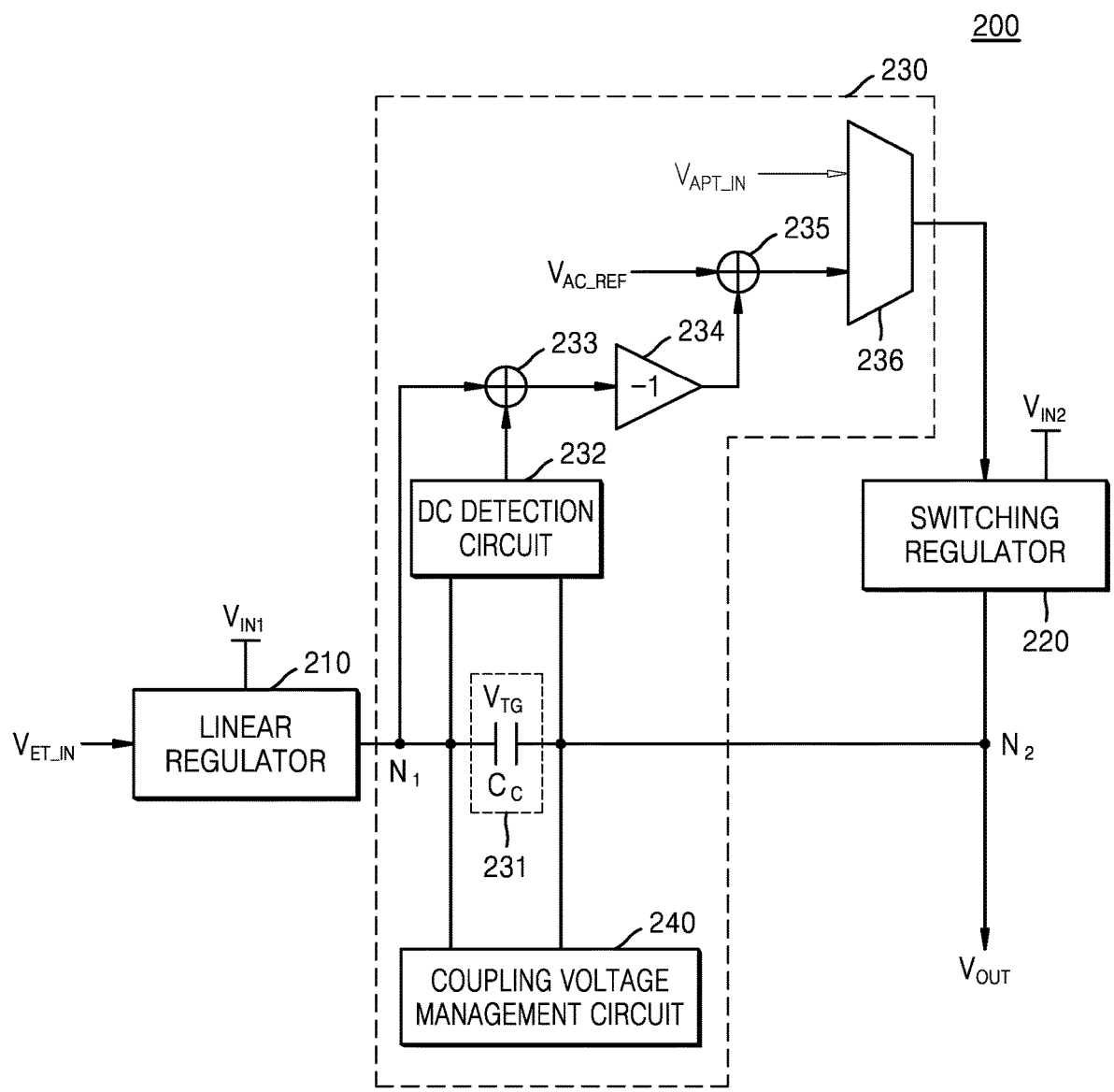
FIG. 5A is a block diagram of the power supply modulator in the ET modulation mode.
Figure 5B:
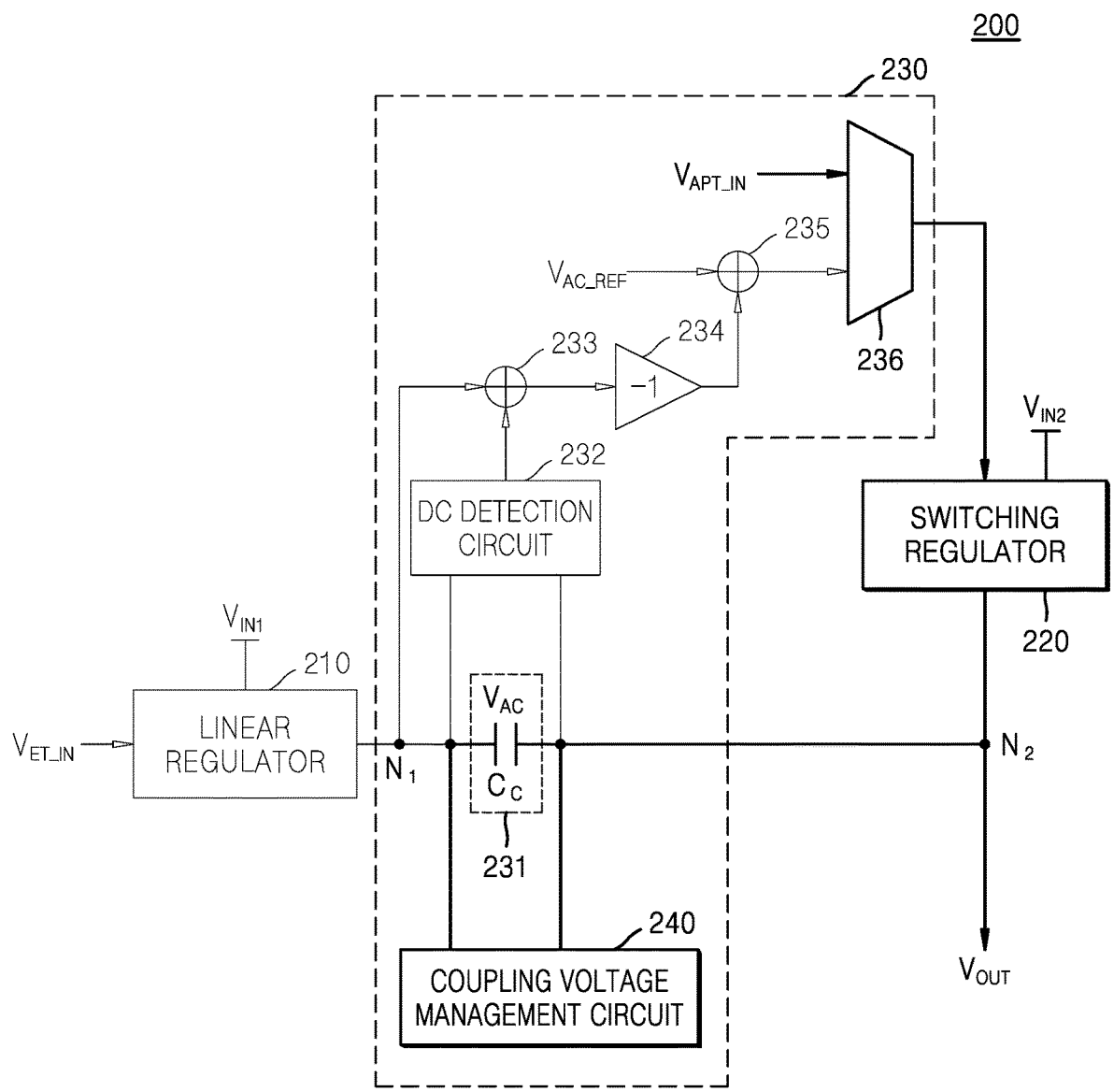
FIG. 5B is a block diagram of the power supply modulator in the APT modulation mode.

FIG. 5A is a block diagram of the power supply modulator 200 in the ET modulation mode, and FIG. 5B is a block diagram of the power supply modulator 200 in the APT modulation mode. Hereinafter, operations of the power supply modulator 200 according to respective modulation modes will be mainly described because a configuration of the power supply modulator 200 has been described with reference to FIG. 3.

Referring to FIG. 5A, in the ET modulation mode, the linear regulator 210 may receive the first envelope signal $V_{ET\_IN}$, amplify the first envelope signal $V_{ET\_IN}$ by using the first supply voltage $V_{IN1}$, and output the amplified first envelope signal $V_{ET\_IN}$ to the mode-based connection circuit 230. A coupling voltage of the coupling circuit 231 may maintain a target coupling voltage $V_{TG}$ in the ET modulation mode, and the coupling circuit 231 may couple only an AC signal from an output signal of the linear regulator 210, which has been received through the first node $N_1$ and output the coupled AC signal to the second node $N_2$. In addition, the mode-based connection circuit 230, based on a configuration of the combiners 233 and 235 and the buffer 234, may generate an output signal for controlling the switching regulator 220 by using the output signal of the linear regulator 210, the target coupling voltage $V_{TG}$ detected by the DC detection circuit 232, and a comparative voltage $V_{AC\_REF}$. The output signal generated by the mode-based connection circuit 230 may be provided to the switching regulator 220 through the multiplexer 236, and the switching regulator 220 may amplify the received signal by using the second supply voltage $V_{IN2}$ and output the amplified signal to the second node $N_2$. That is, the mode-based connection circuit 230 may combine the signal obtained by coupling only the AC signal from the output signal of the linear regulator 210 and the signal output from the switching regulator 220 and output the combined signal as a supply voltage $V_{OUT}$ to an RF power modulator (e.g., 30 of FIG. 1).

Referring to FIG. 5B, in the APT modulation mode, the linear regulator 210 is in a disabled state, and a configuration of the DC detection circuit 232, the combiners 233 and 235, and the buffer 234 may also be disabled by the multiplexer 236. Disabling may indicate a state not used (or selected) in a modulation operation based on a certain modulation mode. The multiplexer 236 may receive the second envelope signal $V_{APT\_IN}$ from a modem (e.g., 10 of FIG. 1) and output the received second envelope signal $V_{APT\_IN}$ to the switching regulator 220. The switching regulator 220 may amplify the second envelope signal $V_{APT\_IN}$ and output the amplified second envelope signal $V_{APT\_IN}$ to the RF power modulator (e.g., 30 of FIG. 1) through the second node $N_2$.

Because the linear regulator 210 is disabled, if a configuration of the coupling voltage management circuit 240 is not provided, the first node $N_1$ may float, and accordingly, it is difficult that a coupling voltage $V_{AC}$ of the coupling circuit 231 is maintained to a target coupling voltage (e.g., $V_{TG}$ of FIG. 5A), due to various causes such as surrounding noise. If the coupling voltage $V_{AC}$ of the coupling circuit 231 is not maintained to the target coupling voltage, when the power supply modulator 200 switches back to the ET modulation mode, a time for making the coupling voltage $V_{AC}$ of the coupling circuit 231 approach the target coupling voltage is required, and during this time, the ET modulation operation may not be smoothly performed. This problem will be described in detail later with reference to FIGS. 6A to 6C.

According to an example embodiment, the coupling voltage management circuit 240 may monitor the coupling voltage $V_{AC}$ of the coupling circuit 231 and perform a management operation for maintaining the coupling voltage $V_{AC}$ to the target coupling voltage (e.g., $V_{TG}$ of FIG. 5A) based on the monitoring result. In detail, the coupling voltage management circuit 240 may compare the coupling voltage $V_{AC}$ with a comparative voltage (e.g., a voltage having the same level as the target coupling voltage), and the coupling voltage management circuit 240 may selectively apply each of voltages having different levels to one terminal of the coupling circuit 231 or the first node $N_1$ according to a level of the coupling voltage $V_{AC}$. For example, when the coupling voltage $V_{AC}$ is higher than the comparative voltage, the coupling voltage management circuit 240 may apply a first voltage to the first node $N_1$ to drop the coupling voltage $V_{AC}$ to the comparative voltage, and when the coupling voltage $V_{AC}$ is lower than the comparative voltage, the coupling voltage management circuit 240 may apply a second voltage to the first node $N_1$ to boost the coupling voltage $V_{AC}$ to the comparative voltage.

According to an example embodiment, the first voltage may correspond to an output voltage of the switching regulator 220 or the second supply voltage $V_{IN2}$ provided to the switching regulator 220. That is, the coupling voltage management circuit 240 may be implemented to apply the output voltage of the switching regulator 220, which is output from the second node $N_2$, to the first node $N_1$ or apply the second supply voltage $V_{IN2}$ to the first node $N_1$. A level of the output voltage of the switching regulator 220 may differ from a level of the second supply voltage $V_{IN2}$, and the coupling voltage management circuit 240 may be implemented to apply, to the first node $N_1$, a voltage having a level at which further effective coupling voltage management may be performed. However, this is only an example embodiment, and thus, the coupling voltage management circuit 240 is not limited thereto, and the coupling voltage management circuit 240 may further include a DC-DC converter configured to directly modulate a voltage of an internal power supply of a wireless communication apparatus (e.g., 1 of FIG. 1) to generate a voltage suitable for the coupling voltage management.

Until the power supply modulator 200 switches from the APT modulation mode to the ET modulation mode, the coupling voltage management circuit 240 may continuously monitor the coupling voltage $V_{AC}$ and perform an operation of managing the coupling voltage $V_{AC}$ based on the monitoring result.

Figure 6A:
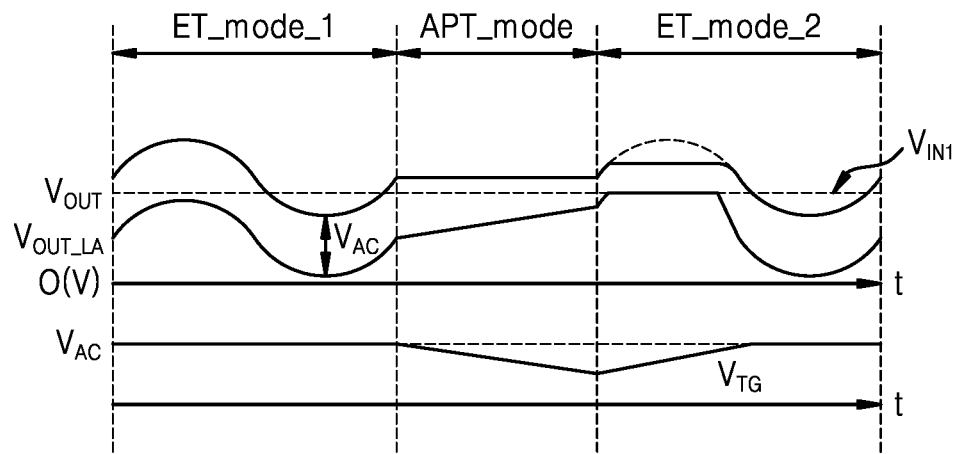
FIGS. 6A, 6B, and 6C are time charts for describing an effect of a power supply modulator according to an example embodiment.
Figure 6B:
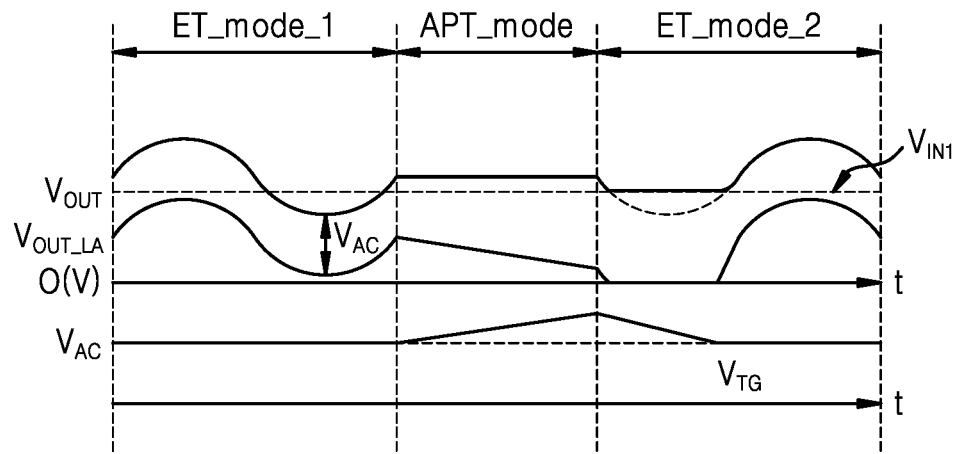
Figure 6C:
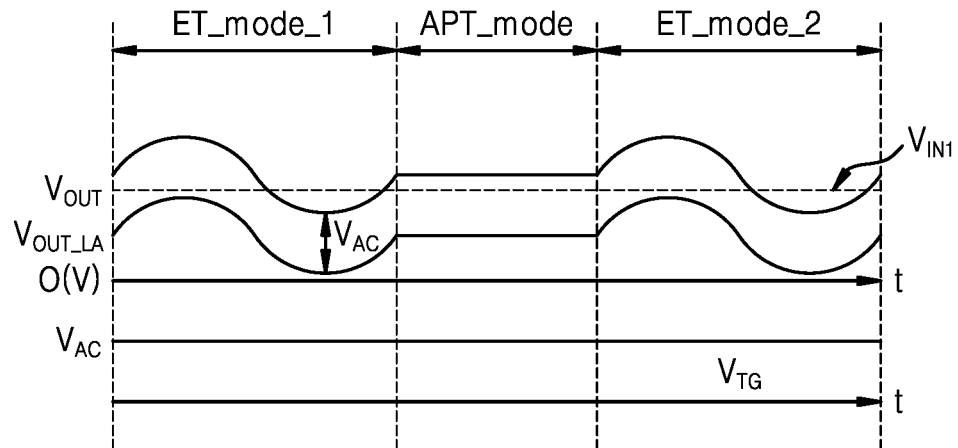

FIGS. 6A to 6C are time charts for describing an effect of a power supply modulator to which an example embodiment is applied.

Referring to FIGS. 3 and 6A, in a case where the coupling voltage management circuit 240 according to an example embodiment is not included, when the power supply modulator 200 switches from a first ET modulation mode ET_mode_1 to the APT modulation mode APT_mode, the coupling voltage $V_{AC}$, which is a voltage of both terminals of the coupling circuit 231, drops in response to a floating state of the first node $N_1$ and is lower than the target coupling voltage $V_{TG}$, and when the power supply modulator 200 switches from the APT modulation mode APT_mode to a second ET modulation mode ET_mode_2, a period in which distortion occurs in an output signal $V_{OUT\_LA}$ of the linear regulator 210 may occur due to limitation of the first supply voltage $V_{IN1}$ provided to the linear regulator 210. Accordingly, the power supply modulation performance of the power supply modulator 200 may be deteriorated in the second ET modulation mode ET_mode_2.

Referring to FIGS. 3 and 6B, in a case where the coupling voltage management circuit 240 according to an example embodiment is not included, when the power supply modulator 200 switches from the first ET modulation mode ET_mode_1 to the APT modulation mode APT_mode, the coupling voltage $V_{AC}$, which is the voltage of the both terminals of the coupling circuit 231, is boosted in response to a floating state of the first node $N_1$ and is higher than the target coupling voltage $V_{TG}$, and when the power supply modulator 200 switches from the APT modulation mode APT_mode to the second ET modulation mode ET_mode_2, a period in which distortion occurs in the output signal $V_{OUT\_LA}$ of the linear regulator 210 may occur due to limitation of a ground voltage 0 V provided to the linear regulator 210. Accordingly, the power supply modulation performance of the power supply modulator 200 may be deteriorated in the second ET modulation mode ET_mode_2.

Referring to FIGS. 3 and 6C, to solve the problems described above, the coupling voltage management circuit 240 according to an example embodiment performs a management operation of maintaining, to the target coupling voltage $V_{TG}$, the coupling voltage $V_{AC}$, which is the voltage of the both terminals of the coupling circuit 231 in the APT modulation mode APT_mode, and thus, unlike the examples of FIGS. 6A and 6B, the power supply modulator 200 may perform a smooth power supply modulation operation in the second ET modulation mode ET_mode_2.

Figure 7:
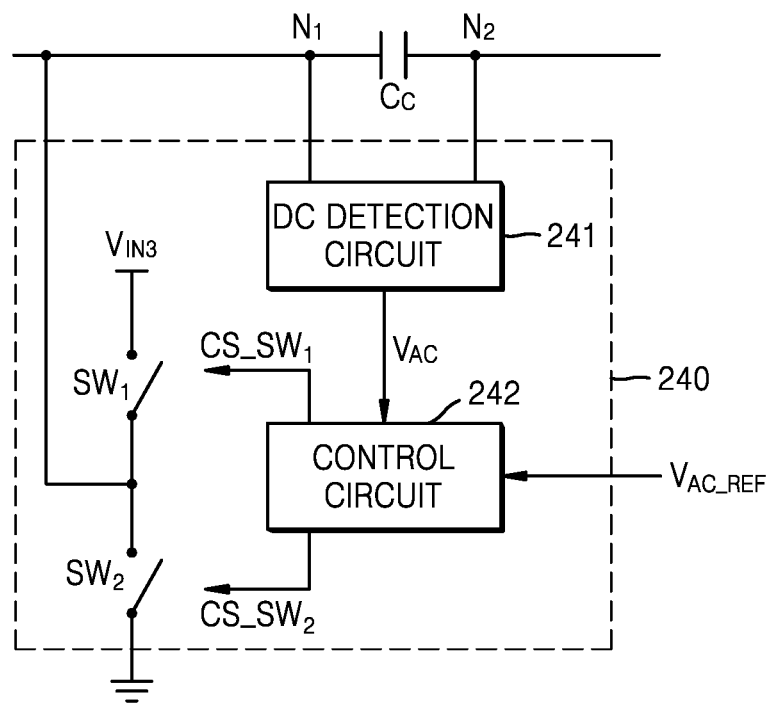
FIG. 7 is a block diagram of a coupling voltage management circuit according to an example embodiment.

FIG. 7 is a block diagram of the coupling voltage management circuit 240 according to an example embodiment. Hereinafter, it is assumed that a coupling circuit is implemented by the coupling capacitor $C_C$, and a power supply modulator operates in the APT modulation mode. However, this is merely for illustrative purposes and the example embodiments are not discloses thereto.

Referring to FIG. 7, the coupling voltage management circuit 240 may include a DC detection circuit 241, a control circuit 242, and a first switch element $SW_1$ and a second switch element $SW_2$. The DC detection circuit 241 may be a circuit which the coupling voltage management circuit 240 separately includes, and may be the same as the DC detection circuit 232 of FIG. 3. That is, when the power supply modulator (e.g., 200 of FIG. 3) operates in the ET modulation mode, the DC detection circuit 232 of FIG. 3 may be used for a modulation operation, and when the power supply modulator operates in the APT modulation mode, the DC detection circuit 232 of FIG. 3 may be used for a coupling voltage management operation. The DC detection circuit 241 may be connected to both terminals of the coupling capacitor $C_C$ (or the first node $N_1$ and the second node $N_2$) to detect the coupling voltage $V_{AC}$ of the coupling capacitor $C_C$ A configuration of the first node $N_1$ and the second node $N_2$ has been described above with reference to FIG. 3 and the like, and thus a detailed description thereof is omitted.

The DC detection circuit 241 may provide the detected coupling voltage $V_{AC}$ to the control circuit 242. The control circuit 242 may control on/off of the first and second switch elements $SW_1$ and $SW_2$ based on the coupling voltage $V_{AC}$ such that the coupling voltage $V_{AC}$ is maintained to the target coupling voltage. The first switch element $SW_1$ may be implemented so as to selectively apply a first voltage $V_{IN3}$ to the first node $N_1$, and the second switch element $SW_2$ may be implemented so as to selectively apply the ground voltage of 0 V to the first node $N_1$ (in other words, the second switch element $SW_2$ may be implemented such that the first node $N_1$ is grounded). According to an example embodiment, the first voltage $V_{IN3}$ may be the same as the second supply voltage $V_{IN2}$ or an output voltage $V_{OUT}$ of the switching regulator (e.g., 220 of FIG. 5B). Alternatively, according to another example embodiment, it may be implemented that a DC voltage close to the ground voltage 0 V is selectively applied to the first node $N_1$ through the second switch element $SW_2$. That is, the coupling voltage management circuit 240 according to an example embodiment is not limited to the configuration shown in FIG. 7 and may be variously implemented so as to selectively apply, to the same node, appropriate voltages by which the coupling voltage $V_{AC}$ may be regulated to be low or high.

The control circuit 242 may compare the coupling voltage $V_{AC}$ with a comparative voltage $V_{AC\_REF}$ that is the same as the target coupling voltage and generate control signals $CS\_SW_1$ and $CS\_SW_2$ for respectively controlling the first switch element $SW_1$ and the second switch element $SW_2$, based on the comparison result. According to an example embodiment, when the coupling voltage $V_{AC}$ is higher than the comparative voltage $V_{AC\_REF}$, the control circuit 242 may turn the first switch element $SW_1$ on and the second switch element $SW_2$ off so as to apply the first voltage $V_{IN3}$ to the first node $N_1$, such that the coupling voltage $V_{AC}$ is dropped to the comparative voltage $V_{AC\_REF}$. In addition, when the coupling voltage $V_{AC}$ is lower than the comparative voltage $V_{AC\_REF}$, the control circuit 242 may turn the first switch element $SW_1$ off and the second switch element $SW_2$ on so as to apply the ground voltage to the first node $N_1$, such that the coupling voltage $V_{AC}$ is boosted to the comparative voltage $V_{AC\_REF}$.

Figure 8:
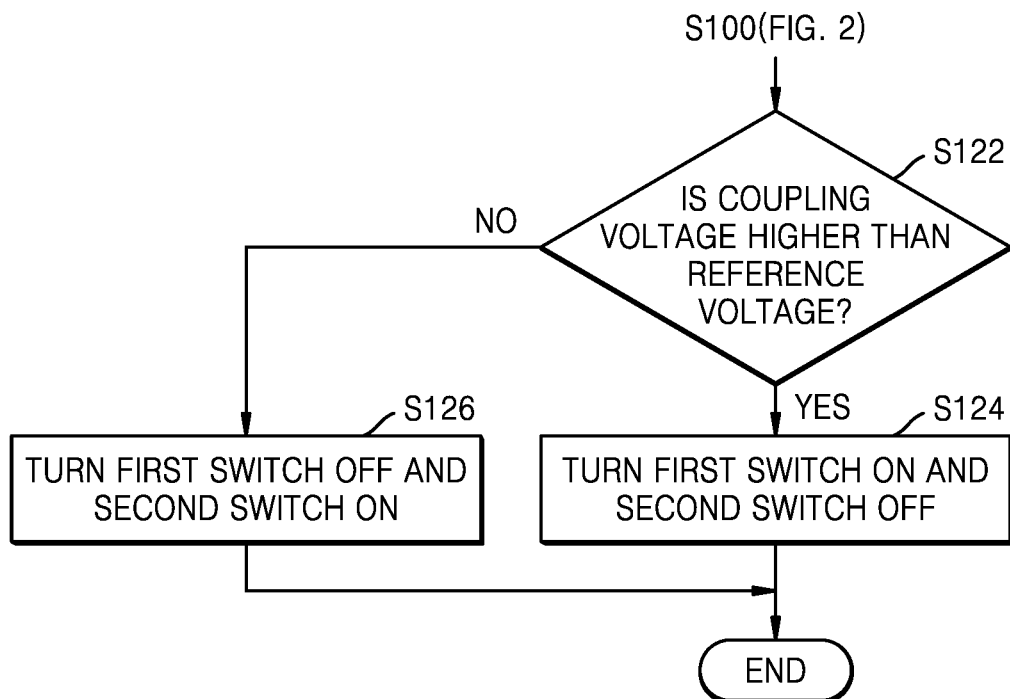
FIG. 8 is a flowchart of an operation of a coupling voltage management circuit, according to an example embodiment.

FIG. 8 is a flowchart of an operation of the coupling voltage management circuit (e.g., 240 of FIG. 7), according to an example embodiment.

Referring to FIGS. 7 and 8, the DC detection circuit 241 may detect the coupling voltage $V_{AC}$ of the coupling capacitor $C_C$ and provide the detected coupling voltage $V_{AC}$ to the control circuit 242. In operation S122, the control circuit 242 may determine whether the coupling voltage $V_{AC}$ is higher than the comparative voltage $V_{AC\_REF}$. When the coupling voltage $V_{AC}$ is higher than the comparative voltage $V_{AC\_REF}$ (S122, YES), the control circuit 242 may turn the first switch element $SW_1$ on and the second switch element $SW_2$ off in operation S124. Otherwise, when the coupling voltage $V_{AC}$ is lower than the comparative voltage $V_{AC\_REF}$ (S122, NO), the control circuit 242 may turn the first switch element $SW_1$ off and the second switch element $SW_2$ on in operation S126. As such, the coupling voltage management circuit 240 may monitor the coupling voltage $V_{AC}$ and selectively apply different voltages to one terminal (or the first node $N_1$) of the coupling capacitor $C_C$ based on the monitoring result.

Figure 9A:
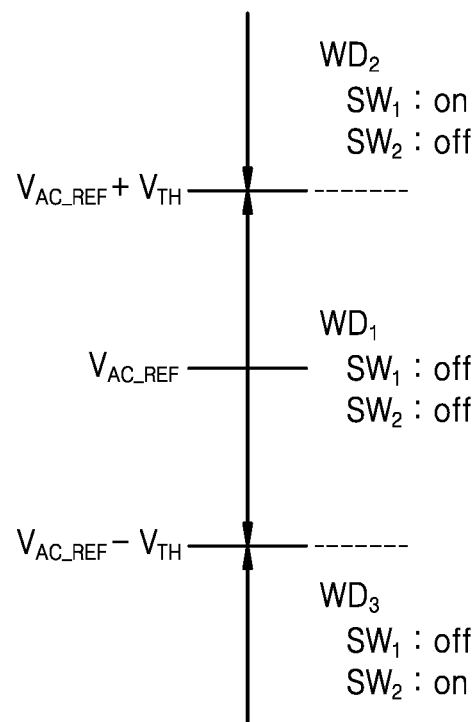
FIG. 9A is a diagram for describing a switching control condition of a coupling voltage management circuit according to an example embodiment.
Figure 9B:
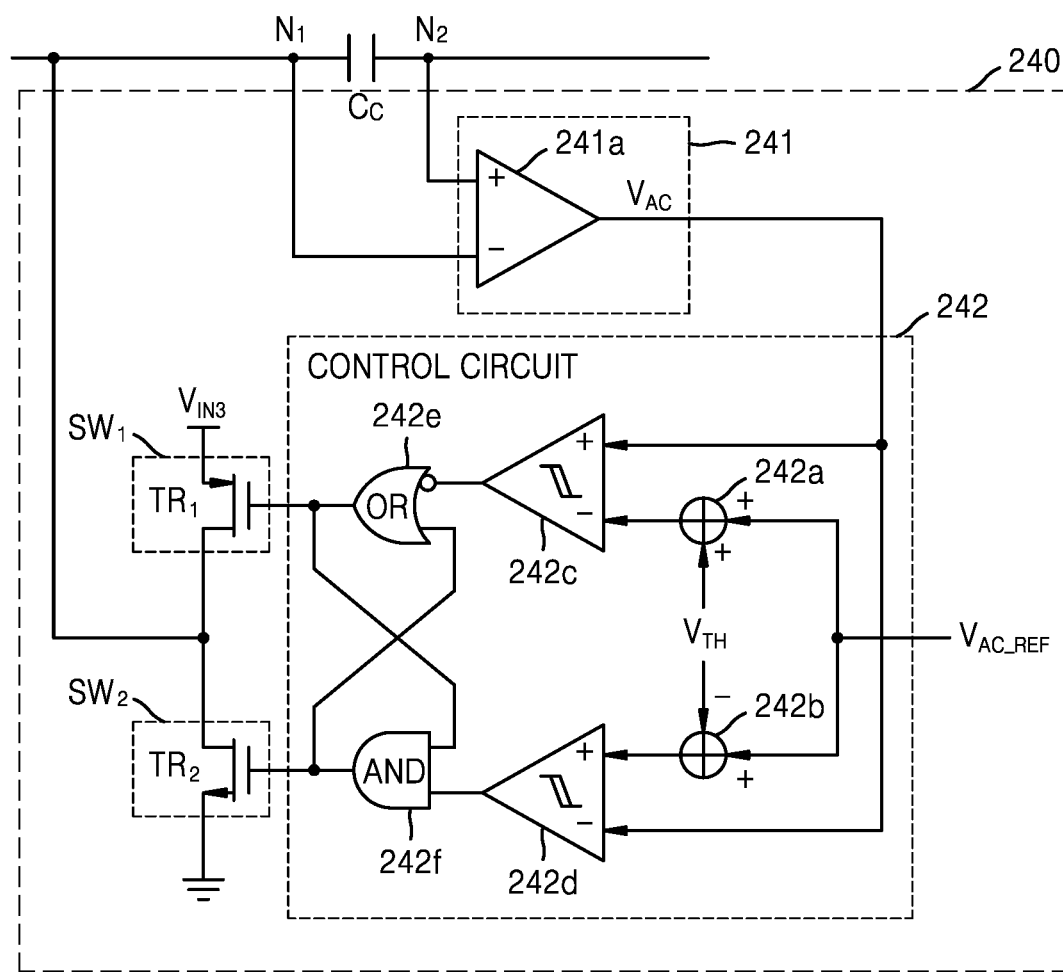
FIG. 9B is a circuit diagram of one example of the coupling voltage management circuit capable of performing an operation of FIG. 9A.

FIG. 9A is a diagram for describing a switching control condition of a coupling voltage management circuit (e.g., 240 of FIG. 7) according to an example embodiment, and FIG. 9B is a circuit diagram of one example of the coupling voltage management circuit 240 capable of performing an operation of FIG. 9A.

Referring to FIGS. 7 and 9A, the control circuit 242 may control application of the first voltage $V_{IN3}$ or the ground voltage to the first node $N_1$ when a difference between the coupling voltage $V_{AC}$ and the comparative voltage $V_{AC\_REF}$ is greater than a threshold $V_{TH}$. According to an example embodiment, the control circuit 242 may control the first and second switch elements $SW_1$ and $SW_2$ according to preset windows.

According to an example embodiment, a first window $WD_1$ includes a case where the coupling voltage $V_{AC}$ is lower than a value obtained by adding the threshold $V_{TH}$ to the comparative voltage $V_{AC\_REF}$ (that is, $V_{AC\_REF}+V_{TH}$) and higher than a value obtained by subtracting the threshold $V_{TH}$ from the comparative voltage $V_{AC\_REF}$ (that is, $V_{AC\_REF}-V_{TH}$), and the control circuit 242 may turn the first switch element $SW_1$ off and the second switch element $SW_2$ off in the first window $WD_1$ such that no voltage is applied to the first node $N_1$.

A second window $WD_2$ includes a case where the coupling voltage $V_{AC}$ is higher than a value obtained by adding the threshold $V_{TH}$ to the comparative voltage $V_{AC\_REF}$, and the control circuit 242 may turn the first switch element $SW_1$ on and the second switch element $SW_2$ off in the second window $WD_2$ such that the first voltage $V_{IN3}$ is applied to the first node $N_1$.

A third window $WD_3$ includes a case where the coupling voltage $V_{AC}$ is lower than a value obtained by subtracting the threshold $V_{TH}$ from the comparative voltage $V_{AC\_REF}$, and the control circuit 242 may turn the first switch element $SW_1$ off and the second switch element $SW_2$ on in the third window $WD_3$ such that the ground voltage is applied to the first node $N_1$.

Hereinafter, with reference to FIG. 9B, an implementation example of the DC detection circuit 241, the control circuit 242, and the first and second switch elements $SW_1$ and $SW_2$ for performing the operation described with reference to FIG. 9A will be mainly described. As shown in FIG. 9B, the DC detection circuit 241 may include a comparator 241a capable of detecting the coupling voltage $V_{AC}$ between the first node $N_1$ and the second node $N_2$. The control circuit 242 may include a first combiner and 242a and a second combiner 242b, a first comparator 242c and a second comparators 242d, and an OR gate 242e and an AND gate 242f The logic gates 242e and 242f may receive comparison results from the first and second comparators 242c and 242d, respectively, and generate control signals for the first and second switch elements $SW_1$ and $SW_2$, respectively. A configuration of the logic gates 242e and 242f may be referred to as a control signal generation circuit.

The first switch element $SW_1$ may include a first transistor (or positive-channel metal oxide semiconductor (PMOS)) $TR_1$, and the second switch element $SW_2$ may include a second transistor (or negative-channel metal oxide semiconductor (NMOS)) $TR_2$. The first combiner 242a may receive the comparative voltage $V_{AC\_REF}$, add the threshold $V_{TH}$ to the comparative voltage $V_{AC\_REF}$, and then provide the addition result to the first comparator 242c. The first comparator 242c may further receive the coupling voltage $V_{AC}$ from the comparator 241a, compare the coupling voltage $V_{AC}$ with the addition result received from the first combiner 242a, and provide an inverted comparison result to the OR gate 242e. The second combiner 242b may receive the comparative voltage $V_{AC\_REF}$, subtract the threshold $V_{TH}$ from the comparative voltage $V_{AC\_REF}$, and then provide the subtraction result to the second comparator 242d. The second comparator 242d may further receive the coupling voltage $V_{AC}$ from the comparator 241a, compare the coupling voltage $V_{AC}$ with the subtraction result received from the second combiner 242b, and provide the comparison result to the AND gate 242f One input terminal of the OR gate 242e may be connected to an output terminal of the AND gate 242f such that the OR gate 242e may receive a signal output from the AND gate 242f as a feedback signal. In addition, one input terminal of the AND gate 242f may be connected to an output terminal of the OR gate 242e such that the AND gate 242f may receive a signal output from the OR gate 242e as a feedback signal. The first transistor $TR_1$ may receive the signal output from the OR gate 242e, through a gate terminal of the first transistor $TR_1$, and selectively apply the first voltage $V_{IN3}$ to the first node $N_1$ based on the received signal. The second transistor $TR_2$ may receive the signal output from the AND gate 242f, through a gate terminal of the second transistor $TR_2$, and selectively apply the ground voltage to the first node $N_1$ based on the received signal.

Through the configuration of the coupling voltage management circuit 240 shown in FIG. 9B, the control circuit 242 may control the first and second switch elements $SW_1$ and $SW_2$ only when the coupling voltage $V_{AC}$ deviates by the threshold $V_{TH}$ or more from the comparative voltage $V_{AC\_REF}$, thereby enabling power consumption according to a switching operation to be minimized and a smooth operation of a power supply modulator in the ET modulation mode to be guaranteed.

Figure 10:
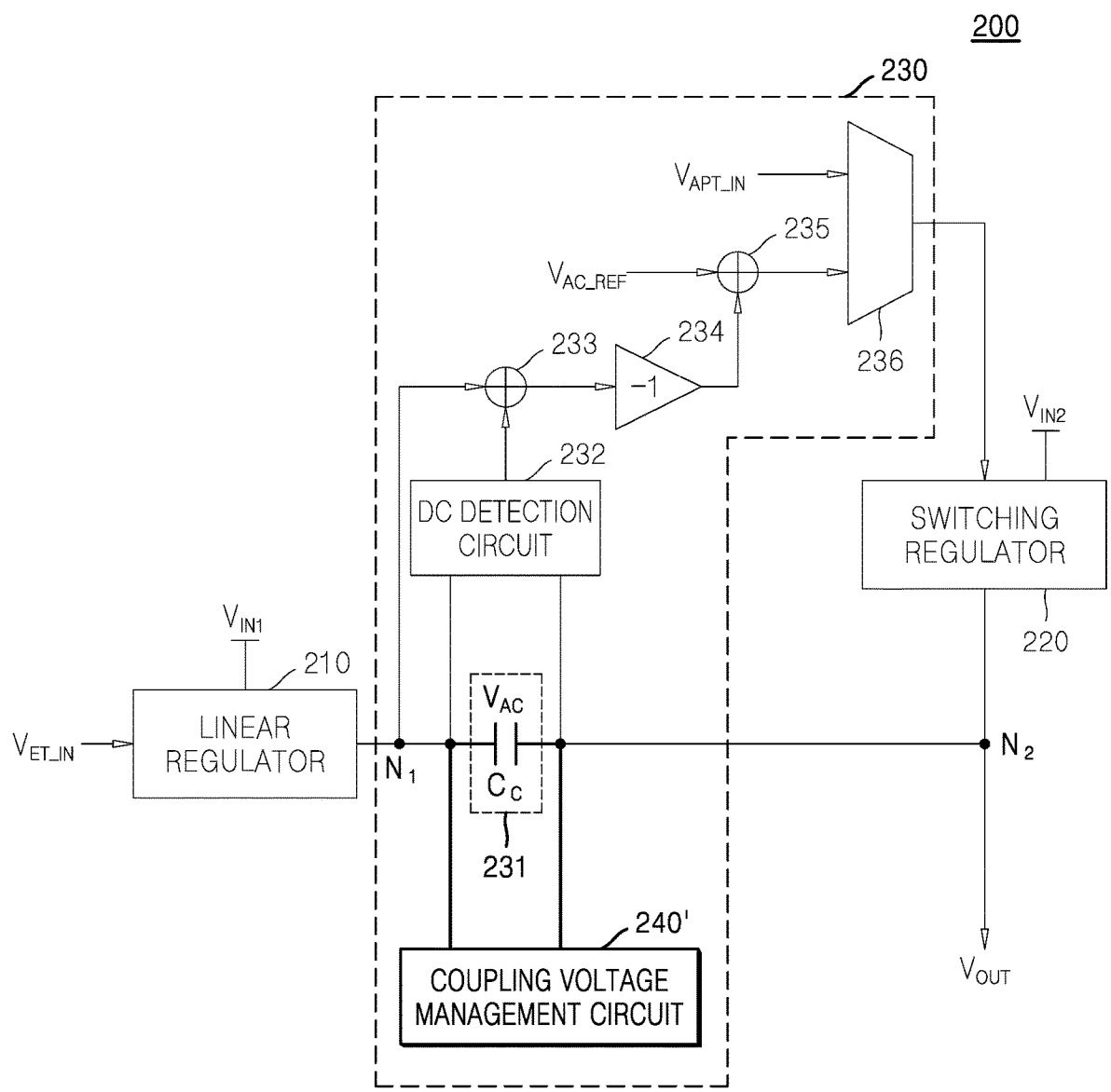
FIG. 10 is a block diagram of the power supply modulator in a standby mode.

FIG. 10 is a block diagram of the power supply modulator 200 in the standby mode. Hereinafter, the configuration of the power supply modulator 200 is the same as described with reference to FIG. 3, and thus, an operation of the power supply modulator 200 in the standby mode will be mainly described.

Referring to FIG. 10, because both the linear regulator 210 and the switching regulator 220 are disabled in the standby mode, both terminals (or the first node $N_1$ and the second node $N_2$) of the coupling circuit 231 may float, and accordingly, it may be difficult to control such that the coupling voltage $V_{AC}$ of the coupling circuit 231 is maintained to the target coupling voltage (e.g., $V_{TG}$ of FIG. 5A), due to various factors such as surrounding noise. In addition, if the power supply modulator 200 enters the standby mode when a wireless communication apparatus is newly turned on, it may be necessary that the coupling circuit 231 is previously charged to the target coupling voltage to prepare for switching to the ET modulation mode.

A coupling voltage management circuit 240' according to an example embodiment may apply the ground voltage to the first node $N_1$ to which the output terminal of the linear regulator 210 and a first terminal of the coupling circuit 231 are connected, and apply a second voltage to the second node $N_2$ to which the output terminal of the switching regulator 220 and a second terminal of the coupling circuit 231 are connected. According to an example embodiment, the second voltage may be the same as the second supply voltage $V_{IN2}$ provided to the switching regulator 220. That is, in the standby mode, the coupling voltage management circuit 240' may provide appropriate voltages to both terminals of the coupling circuit 231, respectively, such that the coupling voltage $V_{AC}$ of the coupling circuit 231 approaches or is maintained to the target coupling voltage (e.g., $V_{TG}$ of FIG. 5A).

Figure 11A:
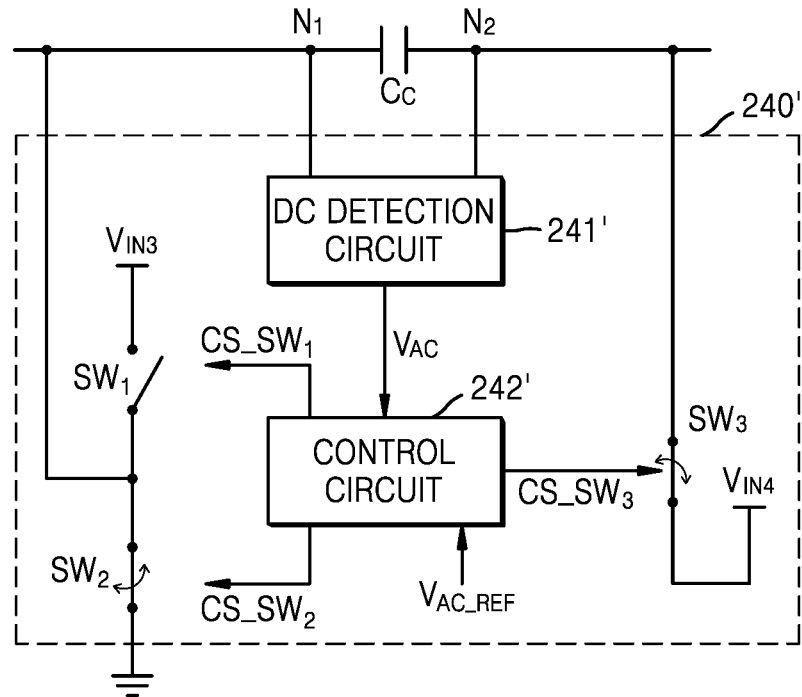
FIGS. 11A and 11B are block diagrams of coupling voltage management circuits according to an example embodiment.
Figure 11B:
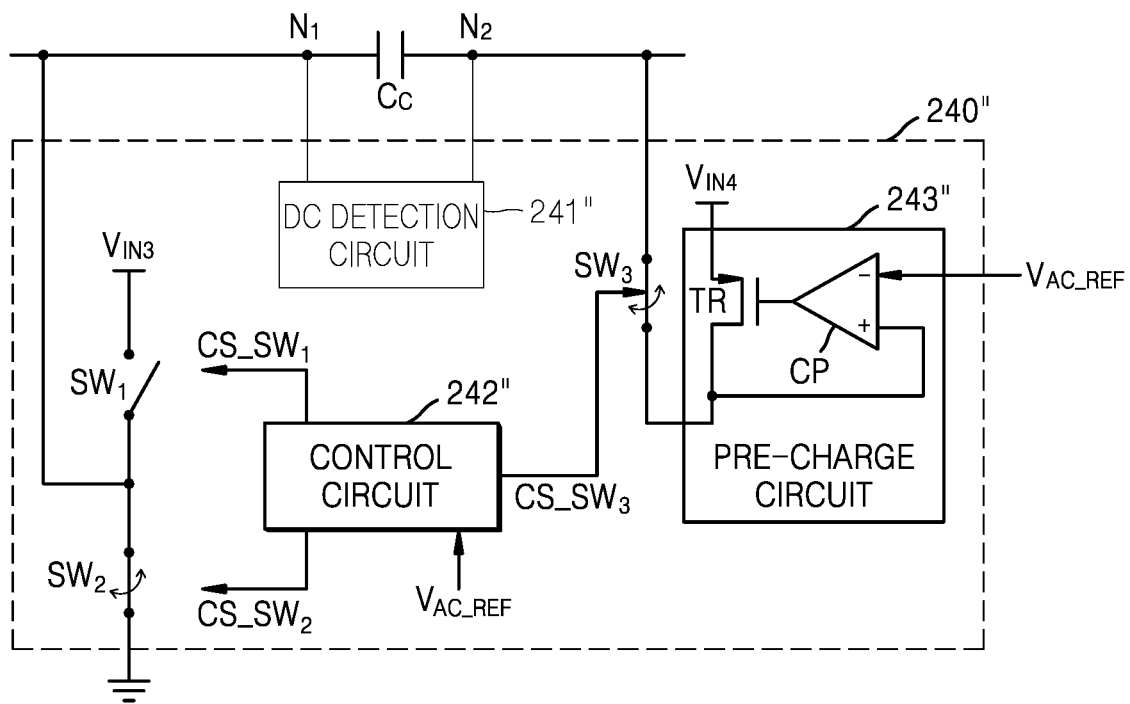

FIGS. 11A and 11B are block diagrams of the coupling voltage management circuit 240' and a coupling voltage management circuit 240" according to an example embodiment. Hereinafter, it is assumed that a coupling circuit is implemented by the coupling capacitor $C_C$ and a power supply modulator operates in the standby mode.

Referring to FIG. 11A, the coupling voltage management circuit 240' may include a DC detection circuit 241', a control circuit 242', and first to third switch elements $SW_1$, $SW_2$, and $SW_3$. The DC detection circuit 241' may be connected to both terminals (or the first node $N_1$ and the second node $N_2$) of the coupling capacitor $C_C$ to detect the coupling voltage $V_{AC}$ of the coupling capacitor $C_C$.

The DC detection circuit 241' may provide the detected coupling voltage $V_{AC}$ to the control circuit 242'. The control circuit 242' may control switching on/off of the first to third switch elements $SW_1$, $SW_2$, and $SW_3$ based on the coupling voltage $V_{AC}$ such that the coupling voltage $V_{AC}$ of the coupling circuit 231 approaches or is maintained to the target coupling voltage. The second switch element $SW_2$ may be implemented to selectively apply the ground voltage of 0 V to the first node $N_1$, and the third switch element $SW_3$ may be implemented to selectively apply a second voltage $V_{IN4}$ to the second node $N_2$. According to an example embodiment, the second voltage $V_{IN4}$ may be the same as the second supply voltage $V_{IN2}$ of a switching regulator (e.g., 220 of FIG. 5B). Furthermore, the third switch element $SW_3$ may be implemented to selectively apply the first voltage $V_{IN3}$ to the first node $N_1$. That is, the coupling voltage management circuit 240' according to an example embodiment is not limited to the configuration shown in FIG. 11A and may be variously implemented to selectively apply appropriate voltages to the first and second nodes $N_1$ and $N_2$, respectively, such that the coupling voltage $V_{AC}$ approaches or is maintained to the target coupling voltage.

The control circuit 242' may compare the coupling voltage $V_{AC}$ with the comparative voltage $V_{AC\_REF}$ that is the same as the target coupling voltage and generate control signals $CS\_SW_1$, $CS\_SW_3$, and $CS\_SW_3$ for respectively controlling the first to third switch elements $SW_1$, $SW_2$, and $SW_3$, based on the comparison result. According to an example embodiment, the control circuit 242' may turn the first switch element $SW_1$ off, the second switch element $SW_2$ on, and the third switch element $SW_3$ on until the coupling voltage $V_{AC}$ approaches or is maintained to the target coupling voltage.

Referring to FIG. 11B, the coupling voltage management circuit 240" may include a DC detection circuit 241", a control circuit 242", a pre-charge circuit 243", and the first to third switch elements $SW_1$, $SW_2$, and $SW_3$. As shown in FIG. 11B, the coupling voltage management circuit 240"

may further include the pre-charge circuit 243" compared to the coupling voltage management circuit 240' of FIG. 11A, and the DC detection circuit 241" may be disabled. The pre-charge circuit 243" may be implemented by a low drop out (LDO) circuit including a transistor TR and a comparator CP. The pre-charge circuit 243" may be implemented to compare a coupling voltage of the coupling capacitor $C_C$ with the comparative voltage $V_{AC\_REF}$ through the comparator CP and apply the second voltage $V_{IN4}$ to the second node $N_2$ until the coupling voltage is the same as the comparative voltage $V_{AC\_REF}$. However, this is only an example embodiment, and thus, the pre-charge circuit 243" is not limited thereto and may be implemented by various circuit configurations capable of charging the coupling capacitor $C_C$ such that the coupling voltage approaches or reach the target coupling voltage.

The control circuit 242" may generate the control signals $CS\_SW_1$, $CS\_SW_2$, and $CS\_SW_3$ for respectively controlling the first to third switch elements $SW_1$, $SW_2$, and $SW_3$ when the power supply modulator operates in the standby mode. According to an example embodiment, the control circuit 242" may turn the first switch element $SW_1$ off, the second switch element $SW_2$ on, and the third switch element $SW_3$ on until the coupling voltage approaches or is maintained to the target coupling voltage.

Through the configurations shown in FIGS. 11A and 11B, the coupling capacitor $C_C$ may be pre-charged (or charged in advance) when the power supply modulator is in the standby mode, such that the power supply modulator may immediately perform a smooth ET modulation operation when the power supply modulator operates in the ET modulation mode.

Figure 12:
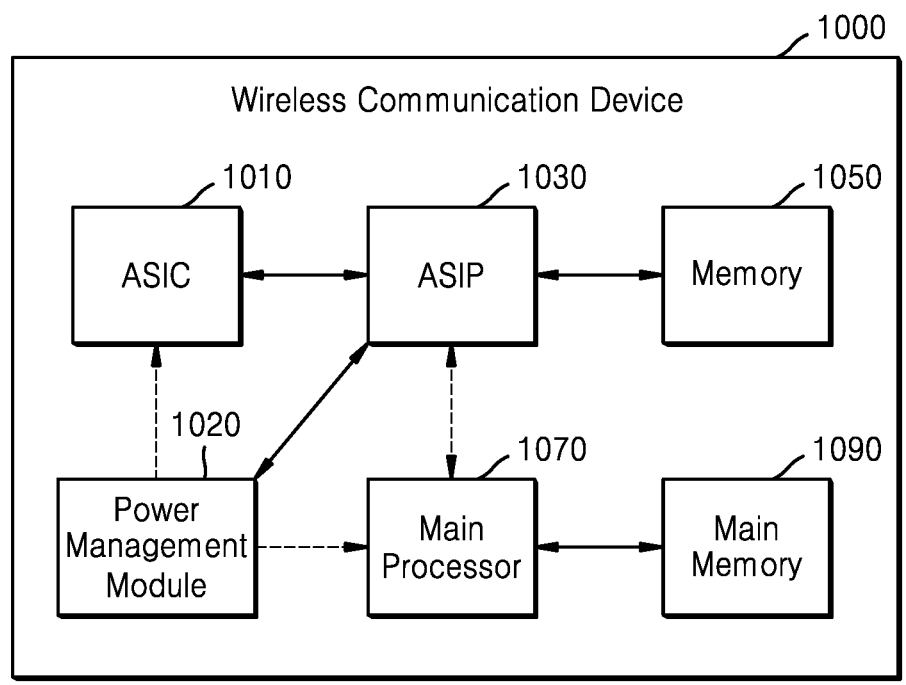
FIG. 12 is a block diagram of a wireless communication apparatus according to an example embodiment.

FIG. 12 is a block diagram of a wireless communication apparatus 1000 according to an example embodiment.

Referring to FIG. 12, as an example of a communication apparatus, the wireless communication apparatus 1000 may include an application specific integrated circuit (ASIC) 1010, a power management module 1020, an application specific instruction set processor (ASIP) 1030, a memory 1050, a main processor 1070, and a main memory 1090. Two or more of the ASIC 1010, the power management module 1020, the ASIP 1030, and the main processor 1070 may communicate with each other. In addition, at least two of the ASIC 1010, the ASIP 1030, the memory 1050, the main processor 1070, and the main memory 1090 may be embedded in a single chip.

The ASIP 1030 is an integrated circuit customized for a particular usage, may support an exclusive instruction set for a particular application, and may execute instructions included in the instruction set. The memory 1050 may communicate with the ASIP 1030, store, as a non-transitory storage device, a plurality of instructions to be executed by the ASIP 1030, and store instructions for performing a coupling voltage management operation according to some embodiments. The memory 1050 may include, as non-limited examples, random types of memories accessible by the ASIP 1030, such as random access memory (RAM), read only memory (ROM), tape, a magnetic disc, an optical disc, a volatile memory, a nonvolatile memory, and a combination thereof. The ASIP 1030 or the main processor 1070 may perform a coupling voltage management operation as described above according to embodiments by executing a series of instructions stored in the memory 1050.

The power management module 1020 may include a power supply modulator according to an example embodiment, and the power supply modulator may manage a coupling voltage of a coupling circuit such that the coupling voltage is constantly maintained to a target coupling voltage in modulation modes other than the ET modulation mode.

The main processor 1070 may control the wireless communication apparatus 1000 by executing a plurality of instructions. For example, the main processor 1070 may control the ASIC 1010 and the ASIP 1030, process data received through a wireless communication network, and process a user input to the wireless communication apparatus 1000. The main memory 1090 may communicate with the main processor 1070 and store, as a non-transitory storage device, a plurality of instructions to be executed by the main processor 1070.

At least one of the components, elements, modules or units described herein may be embodied as various numbers of hardware, software and/or firmware structures that execute respective functions described above, according to an exemplary embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in some of block diagrams, communication between the components, elements or units may be performed through the bus. Functional aspects of the above exemplary embodiments may be implemented in algorithms that execute on one or more processors. Furthermore, the components, elements or units represented by a block or processing operations may employ any number of related art techniques for electronics configuration, signal processing and/or control, data processing and the like.

The foregoing embodiments are merely intended for describing the technical solutions, but not for limiting the disclosure. Although the disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments.

What is claimed is:

1. An operating method of a power supply modulator in a plurality of modulation modes to generate a supply voltage, the operating method comprising:

outputting, by a linear regulator, an envelope signal in an envelope tracking (ET) modulation mode of the plurality of modulation modes;

outputting, by a switching regulator, a direct current (DC) signal in the ET modulation mode or an average power tracking (APT) modulation mode of the plurality of modulation modes;

keeping, by a coupling circuit, the envelope signal of the linear regulator smaller than the supply voltage by a target coupling voltage by coupling the envelope signal of the linear regulator in the ET modulation mode to a direct current signal; and selectively applying, by a coupling voltage management circuit, at least one of voltages to at least one of a first terminal or a second terminal of the coupling circuit to maintain a coupling voltage of the coupling circuit at the target coupling voltage in at least one of a modulation mode other than the ET modulation mode.

2. The operating method of claim 1, wherein the selectively applying the at least one of voltages to the at least one of the first terminal or the second terminal of the coupling circuit, comprise:

selectively applying, by the coupling voltage management circuit, any one of a first voltage and a ground voltage as the at least one of voltages to a first node to which an output terminal of the linear regulator and the first terminal of the coupling circuit are connected, in the APT modulation mode.

3. The operating method of claim 2, wherein the selectively applying, by the coupling voltage management circuit, any one of the first voltage and the ground voltage as the at least one of voltages to the first node, comprises:

applying the first voltage to the first node in response to the coupling voltage being higher than the target coupling voltage; and applying the ground voltage to the first node in response to the coupling voltage being lower than the target coupling voltage.

4. The operating method of claim 2, wherein the selectively applying, by the coupling voltage management circuit, any one of the first voltage and the ground voltage as the at least one of voltages to the first node, comprises;

applying the first voltage to the first node in response to the coupling voltage being higher than a value obtained by adding a threshold to the target coupling voltage; and applying the ground voltage to the first node in response to the coupling voltage being lower than a value obtained by subtracting the threshold from the target coupling voltage.

5. The operating method of claim 2, wherein a level of the first voltage is the same as a level of a second node to which the output terminal of the switching regulator and the second terminal of the coupling circuit are connected.

6. The operating method of claim 5, wherein the selectively applying the at least one of voltages to the at least one of the first terminal or the second terminal of the coupling circuit, further comprises:

applying, by the coupling voltage management circuit, the ground voltage to the first node and apply a second voltage to the second node in a standby mode of the plurality of modulation modes.

7. The operating method of claim 1, wherein the applying the at least one of voltages to the at least one of the first terminal or the second terminal of the coupling circuit, comprises:

detecting, by a detection circuit, the coupling voltage; and selectively applying the at least one of voltages based on comparison between the coupling voltage and the target coupling voltage, wherein the detection circuit is configured to be connected to the first terminal and the second terminal of the coupling circuit in the modulation mode other than the ET modulation mode.

8. The operating method of claim 7, wherein the coupling voltage management circuit is further configured to be connected to the coupling circuit through first lines for detecting the coupling voltage and through a second line for applying the at least one of voltages to the at least one of the first terminal or the second terminal of the coupling circuit.

9. A power supply modulator operating to generate a supply voltage in a plurality of modulation modes, the power supply modulator comprising:

a linear regulator;

a switching regulator; and a mode-based connection circuit configured to control a connection between the linear regulator and the switching regulator based on a modulation mode of the plurality of modulation modes, the mode-based connection circuit comprising:

a coupling circuit configured to keep an output signal of the linear regulator lower than the supply voltage as much as by a target coupling voltage in an envelope tracking (ET) modulation mode of the plurality of modulation modes, and a coupling voltage management circuit configured to monitor a coupling voltage of the coupling circuit in at least one of modulation modes other than the ET modulation mode, and selectively apply at least one of voltages to the coupling circuit based on a monitoring result such that the coupling voltage of the coupling circuit is maintained at the target coupling voltage, wherein the coupling voltage management circuit comprises:

a first switch element configured to selectively apply a first voltage as the at least one of voltages to a first node to which an output terminal of the linear regulator and a first terminal of the coupling circuit are connected; and a second switch element configured to selectively apply a ground voltage as the at least one of voltages to the first node.

10. The power supply modulator of claim 9, wherein the coupling voltage management circuit is further configured to turn off the first switch element and the second switch element in the ET modulation mode.

11. The power supply modulator of claim 9, wherein in an average power tracking (APT) modulation mode the coupling voltage management circuit is further configured to:

turn on the first switch element and turn off the second switch element in response to the coupling voltage being higher than the target coupling voltage, and turn off the first switch element and turn on the second switch element in response to the coupling voltage being lower than the target coupling voltage.

12. The power supply modulator of claim 9, wherein in an average power tracking (APT) modulation mode, the coupling voltage management circuit is further configured to:

turn on the first switch element and turn off the second switch element in response to the coupling voltage is higher than a value obtained by adding a threshold to the target coupling voltage, and turn off the first switch element and turn on the second switch element in response to the coupling voltage being lower than a value obtained by subtracting the threshold from the target coupling voltage.

13. The power supply modulator of claim 9, wherein the coupling voltage management circuit further comprises:

a detection circuit connected to the first terminal and a second terminal of the coupling circuit and configured to detect the coupling voltage; and a control circuit configured to receive the coupling voltage from the detection circuit, and configured to control on/off switching of the first switch element and the second switch element based on comparison between the coupling voltage and the target coupling voltage.

14. The power supply modulator of claim 9, wherein the coupling voltage management circuit further comprises:
  a first comparator connected to the first terminal and a second terminal of the coupling circuit and configured to output the coupling voltage based on comparison between voltages of the first terminal and the second terminal;
  a first combiner configured to receive a comparative voltage corresponding to the target coupling voltage and output a first result obtained by adding a threshold to the comparative voltage;
  a second combiner configured to receive the comparative voltage and output a second result obtained by subtracting the threshold from the comparative voltage;
  a second comparator configured to receive the coupling voltage and the first result, and output a third result based on comparison between the coupling voltage and the first result;
  a third comparator configured to receive the coupling voltage and the second result, and output a fourth result based on comparison between the coupling voltage and the second result; and
  a control signal generation circuit configured to receive the third result and the fourth result and generate control signals for the first switch element and the second switch element.

15. The power supply modulator of claim 14, wherein the control signal generation circuit comprises an OR gate and an AND gate,
  a first input terminal of the OR gate is connected to an output terminal of the AND gate, a second input terminal of the OR gate receives an inverted signal of the third result output from the second comparator, and
  a first input terminal of the AND gate is connected to an output terminal of the OR gate, and a second input terminal of the AND gate receives the fourth result output from the third comparator.

16. The power supply modulator of claim 9, wherein the coupling voltage management circuit further comprises a third switch element configured to selectively apply a second voltage to a second node to which an output terminal of the switching regulator and a second terminal of the coupling circuit are connected.

17. The power supply modulator of claim 16, wherein the coupling voltage management circuit is further configured to turn off the first switch element, turn on the second switch element, and turn on the third switch element in a standby mode.

18. The power supply modulator of claim 17, wherein a level of the first voltage is greater than a level of the second voltage.

19. The power supply modulator of claim 16, wherein the coupling voltage management circuit further comprises a pre-charge circuit configured to compare the coupling voltage with the target coupling voltage and apply the second voltage to the second node until the coupling voltage is the same as the target coupling voltage in a standby mode.

20. The power supply modulator of claim 19, wherein the pre-charge circuit comprises a low drop out circuit including at least one transistor and a least one comparator.

* * * * *